(12) United States Patent
Shabtay

(10) Patent No.: US 9,605,446 B2
(45) Date of Patent: Mar. 28, 2017

(54) PORTABLE ELECTRONIC DEVICE INTEGRATED WITH A KEY

(71) Applicants: Lior Shabtay, Nave Monson (IL); Etay Hugi, Ramat Gan (IL); Eli Ophir, Ramat Efal (IL)

(72) Inventor: Lior Shabtay, Nave Monson (IL)

(*) Notice: Subject to any disclaimer, the term of this patent is extended or adjusted under 35 U.S.C. 154(b) by 0 days.

(21) Appl. No.: 15/028,526

(22) PCT Filed: Oct. 14, 2014

(86) PCT No.: PCT/IL2014/000052
§ 371 (c)(1),
(2) Date: Apr. 11, 2016

(87) PCT Pub. No.: WO2015/052696
PCT Pub. Date: Apr. 16, 2015

(65) Prior Publication Data
US 2016/0251875 A1 Sep. 1, 2016

(30) Foreign Application Priority Data

Oct. 13, 2013 (IL) .......................................... 228846

(51) Int. Cl.
*G06F 1/16* (2006.01)
*E05B 19/04* (2006.01)
(Continued)

(52) U.S. Cl.
CPC ............ *E05B 19/043* (2013.01); *E05B 19/04* (2013.01); *E05B 19/26* (2013.01); *G06F 1/18* (2013.01);
(Continued)

(58) Field of Classification Search
CPC ........ E05B 19/043; E05B 19/04; E05B 19/26; H05K 5/0278; G06F 1/18; G06F 1/181; G06F 1/183; G06F 13/4068; G06F 13/4081
(Continued)

(56) References Cited

U.S. PATENT DOCUMENTS 4,686,358 A    8/1987   Seckinger et al.
6,705,141 B1 *   3/2004   Jacob .................... E05B 19/043
                                                 70/278.3

(Continued)

FOREIGN PATENT DOCUMENTS

CN     201838327 U    5/2011
CN     202215073 U *   5/2012
(Continued)

*Primary Examiner* — Nidhi Thaker
(74) *Attorney, Agent, or Firm* — Mark David Torche; Patwrite LLC

(57) ABSTRACT

A key having a gripping portion, the key is left protruding so that torque can be applied by the key user. The gripping portion includes a gripping portion structure. The gripping portion structure further includes an electronic device having a plug connectable to a plug receptacle of electronic appliance. The electronic device integrated in the gripping portion structure. Along at least one side of the gripping portion structure disposed an elongated slot which is wide enough to be used as a key ring receptacle where the key ring, can pass through. The key gripping portion have a freedom of movement for the key user to move the key around the key ring and also a freedom of movement to cross the key ring to either direction, inwardly or outwardly for enabling comfortable access of the plug of the electronic device to be connected to the plug receptacle of electronic appliance.

11 Claims, 4 Drawing Sheets

(51) Int. Cl.
  *G06F 1/18* (2006.01)
  *H05K 5/02* (2006.01)
  *E05B 19/26* (2006.01)
  *G06F 13/40* (2006.01)

(52) U.S. Cl.
  CPC .......... *G06F 1/181* (2013.01); *G06F 13/4068* (2013.01); *H05K 5/0278* (2013.01)

(58) Field of Classification Search
  USPC ............... 361/679.01–679.31, 679.4–679.45, 361/679.55–679.59
  See application file for complete search history.

(56) References Cited

U.S. PATENT DOCUMENTS

| | | | |
|---|---|---|---|
| D570,597 S | 6/2008 | Klein | |
| 7,673,357 B1* | 3/2010 | Stump | A44B 15/005 7/151 |
| D686,631 S | 7/2013 | Iversen | |
| D686,632 S | 7/2013 | Iversen | |
| 8,894,427 B2 | 11/2014 | Agreda de Ro et al. | |
| 2006/0190664 A1* | 8/2006 | Chen | B60R 25/00 710/313 |
| 2007/0111583 A1* | 5/2007 | Cuellar | H01R 13/447 439/353 |
| 2010/0255697 A1* | 10/2010 | Cabes | H05K 5/0278 439/142 |
| 2011/0237099 A1* | 9/2011 | Ni | G06K 19/07732 439/142 |
| 2011/0304971 A1* | 12/2011 | Kelley | H05K 5/0278 361/679.31 |
| 2012/0212897 A1* | 8/2012 | Lo | H05K 5/0278 361/679.31 |
| 2014/0340836 A1* | 11/2014 | Hsieh | H05K 5/0278 361/679.32 |

FOREIGN PATENT DOCUMENTS

| | | |
|---|---|---|
| CN | 103174329 A | 6/2013 |
| DE | 202005003610 U1 | 5/2005 |

\* cited by examiner

PORTABLE ELECTRONIC DEVICE INTEGRATED WITH A KEY

FIELD OF THE INVENTION

The present invention relates to a method and a system for integrating electronic device in a key, in particular, the present invention concerns a detachable and/or foldable electronic device integrated in the grip portion of a key.

BACKGROUND OF THE INVENTION

A typical key is a small piece of metal or any other suitable rigid material consisting of two parts: the blade, which slides into the keyway of the lock and distinguishes between different keys, and the gripping portion, which is left protruding so that torque can be applied by the user. A key is usually intended to operate one specific lock or a small number of locks that are keyed alike, so each lock requires a unique key.

A USB flash drive is a data storage device that includes flash memory with an integrated Universal Serial Bus (USB) interface. Typically such USB drive further includes USB housing and a USB plug protruding from one edge of the housing. The USB flash drive is typically provided with a cap having an open side for covering the USB plug and thus protects the USB plug when the USB flash drive not in use.

USB drivers attached to a key ring are well known and commonly used. Such issues are addressed for example in WO 2009/073936, US 2012/0212897, US D686,631, USD D686,632 and US D570,597.

WO 2009/073936 discloses a USB stick of the type which mainly consists of a housing with a memory and a USB plug protruding from an edge of the housing and a cap which can be provided over the USB plug with an open side so as to protect the latter, characterized in that the USB stick is provided with means which connect the housing and the cap, in the open as well as in the closed position.

US 2012/0212897 discloses a portable storage device comprises a memory device, a housing and a locking mechanism. The memory device includes an upper and a lower covers, and a memory with one end clamped therebetween, and another end of the memory is an USB connector for connecting to computer. The housing is provided with two ears at both sides thereof, and each of the ears is formed with a through hole. The locking mechanism comprises a flexible member, and both ends of the flexible member being formed with a locking portion, each of the locking portions is inserted through the through holes of the ears and engaged with a locking members, respectively. The locking portions of the flexible member are formed with outer threads for meshing with inner threads of the locking member. The portable storage device can also be used to carry small objects in addition to being used as storage device.

Electronic circuit attached to a key gripping portion is known and disclosed for example in U.S. Pat. No. 4,686,358.

U.S. Pat. No. 4,686,358 discloses a metal flat key with depressions arranged in the key shank for receiving radially displaceably tumbler pins located in the lock rotor for use as a mechanical key outside and as a mechanical/electronic key inside a closing means with additional electronic means arranged in the lock cylinder includes a casing for receiving an electronic assembly and which is fixed to the key shank, the casing simultaneously being used as the key grip. The casing on the casing side to the key shank has a connecting part for receiving electric contacts between grip and key shank.

Electronic device that is removably connected to a cap and pivotally released from the cap is disclosed for example in WO 2013/102001.

WO 2013/102001 discloses an electronic device, which may be a USB device, includes a body part that is removably connected to a cap. The body part includes a connector for plugging the device into a host computing device. The cap includes a lever part and a main part. The lever part of the cap is attached to the main part and pivots at least partially around a pivot axis. The lever part includes an anchor part on one side of the pivot axis and an unlock part on the other side of the pivot axis. The anchor part includes a hook that engages a cavity in the body part when the cap is connected to the body part. Depressing the unlock part of the cap causes the lever to pivot around the pivot axis thereby disengaging the hook from the first cavity, and thereby releasing the cap from the body part.

Such USB flash drivers or any other small electronic device having a cap and a plug often gets lost due to their smaller dimensions. Thus, one object of the present invention is to provide a small electronic device integrated in the gripping portion of a key wherein the plug of the electronic device is protected from being damaged when the device is in a closed position.

Another object of the present invention is to provide a key integrated with an electronic device that fits to a key ring and thus enables the electronic device to be along with a user whenever and wherever he needs the device.

Yet another object of the present invention is to provide a key integrated with an electronic device that fits to a key ring where the plug of the electronic device can be connected to a plug receptacle without removing the key from the key ring.

Yet another object of the present invention is to allow the gripping portion of the key that fits to the key ring to be able to have certain freedom of movement for moving along the ring and crossing the ring. This freedom of movement enables the plug of the electronic device to be freely connected to a plug receptacle particularly when there is a bunch of keys on the key ring.

Yet another object of the present invention is to provide an electronic device integrated in a key, where the electronic device is connectable to a computer plugs receptacle even when there is a lack of space around the computer's plugs receptacle such as USB plug receptacle.

Yet another object of the present invention is to provide a removable electronic device integrated in a key that is connectable to a slot of a computer or any other appliance. Examples of such electronic devices connectable to a slot of a computer or any other appliances are: HDMI adaptors, USB memory sticks, USB authentication tokens, wireless modems with a USB slot, and so forth.

SUMMARY OF THE INVENTION

The present invention relates to a method and a system integrating electronic device in a key, in particular, the present invention concerns a detachable and/or foldable electronic device integrated in the grip portion of a key.

In accordance with an embodiment of the present invention there is provided a key held by a key-ring. The key have a blade which slides into a keyway of a lock and distinguishes between different keys. The key further have a gripping portion so that torque can be applied by the key user. The gripping portion includes a gripping portion structure. The gripping portion structure further includes an electronic device having a plug connectable to a plug receptacle of electronic appliance. The electronic device integrated in the gripping portion structure. Along at least one side of the gripping portion structure disposed an elongated slot which is wide enough to be used as a key ring receptacle where the key ring, can pass through. The key gripping portion have a freedom of movement for the key user to move the key around the key ring and also a freedom of movement to cross the key ring to either direction, inwardly or outwardly for enabling comfortable access of the plug of the electronic device to be connected to the plug receptacle of electronic appliance.

BRIEF DESCRIPTION OF THE DRAWINGS

The invention may be understood upon reading of the following detailed description of non-limiting exemplary embodiments thereof, with reference to the following drawings, in which.

The following detailed description of the invention refers to the accompanying drawings referred to above. Dimensions of components and features shown in the figures are chosen for convenience or clarity of presentation and are not necessarily shown to scale. Wherever possible, the same reference numbers will be used throughout the drawings and the following description to refer to the same and like parts.

DETAILED DESCRIPTION OF EMBODIMENTS OF THE INVENTION

Figure 1:
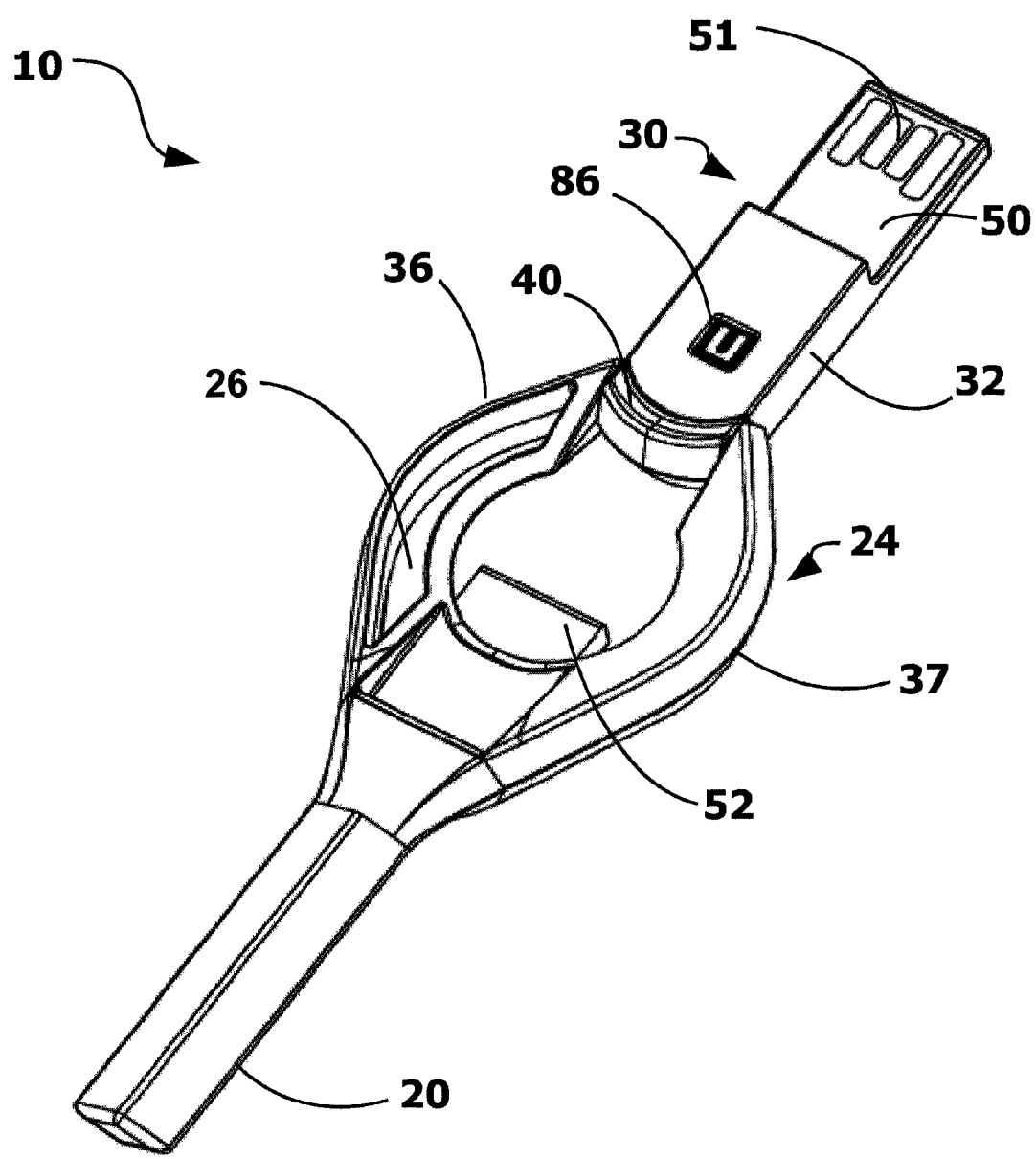
FIG. 1 is a perspective front view of a portable electronic device integrated in the gripping portion of a key in accordance with one embodiment of the present invention where the portable electronic device is in an open position.

Referring first to FIG. 1, there is shown a portable electronic device 30 integrated with a key 10. The key 10 includes two main parts the blade 20 which slides into the keyway of a lock and distinguishes between different keys, and the gripping portion structure 24. The portable electronic device 30 is pivotally connected to the upper portion of the key gripping portion structure 24 by a gripping portion pivot support 40.

Figure 2:
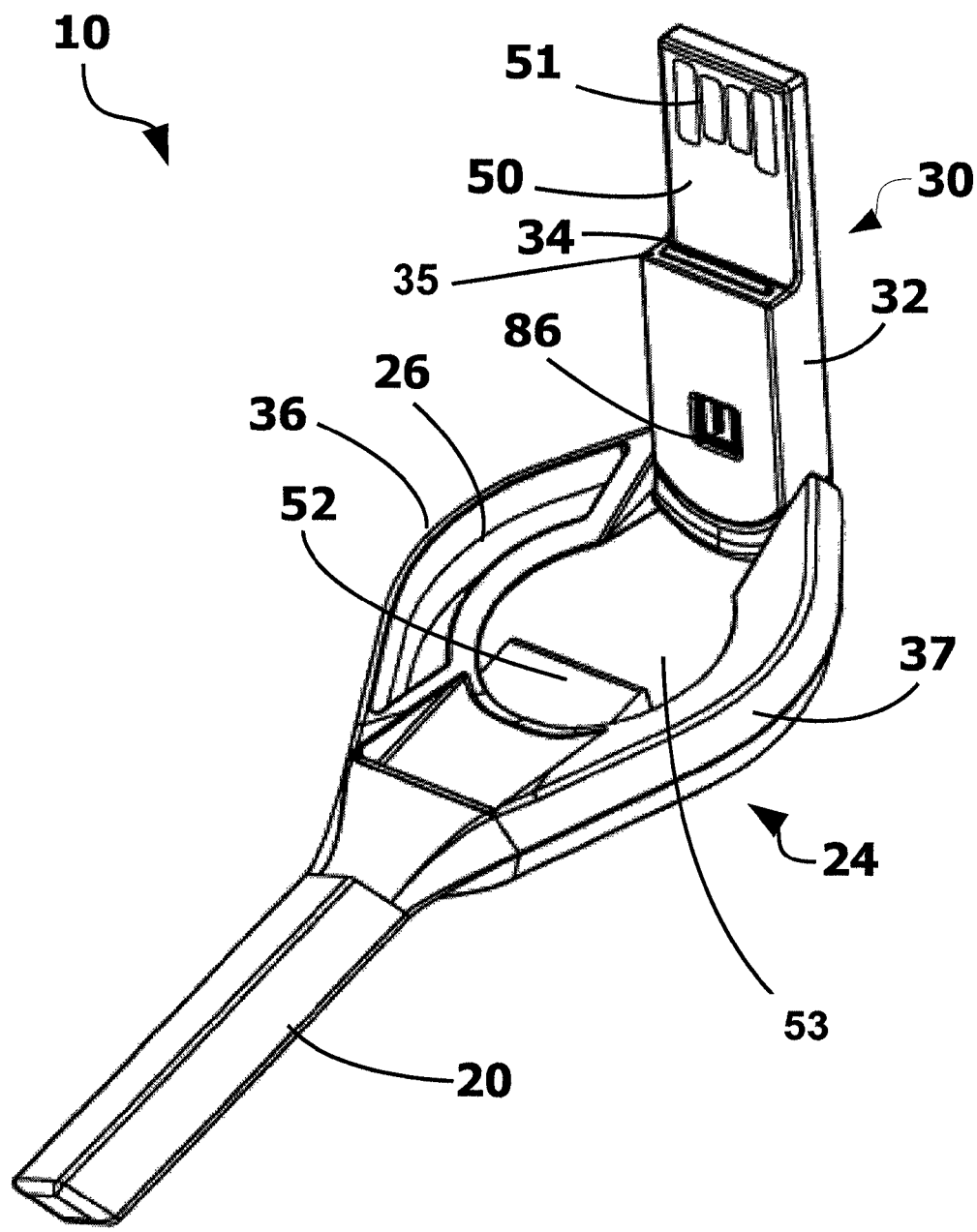
FIG. 2 is a perspective front view of a portable electronic device integrated in the gripping portion of a key in accordance with one embodiment of the present invention where the portable electronic device is in partially open position.

The portable electronic device 30 includes an electronic plug, contacts or adapter 50 to be connected respectively to a plug receptacle, a contact receptacle or adapter receptacle of a computer or any other suitable electronic appliance having the appropriate plugs, contacts or adaptors receptacles. The electronic device 30 may be but not limited to a portable storage device, a portable modem, an HDMI adapter and so forth. The portable electronic device 30 further includes electronic device housing 32 which houses fully or partially the electronic device 30. Referring also to FIG. 2, a protruded element 34 extends from the outer surface 35 of housing 32.

Along one side 36 of the gripping portion structure 24 there is provided an elongated slot 26 which is wide enough to be used as a key ring receptacle where the key ring, not shown, can pass through. In some variations of the present invention elongated slots can be provided on both sides 36 and 37 of the gripping portion and may have the same shape.

Figure 3:
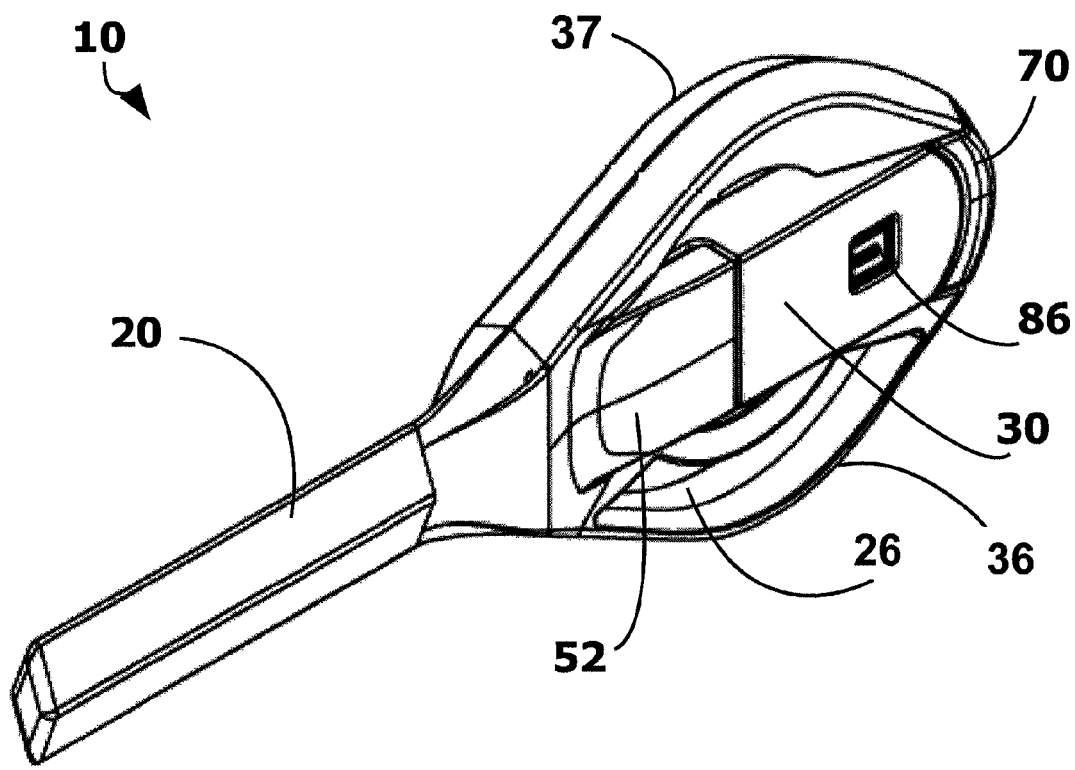
FIG. 3 is a perspective front view of a portable electronic device integrated in the gripping portion of a key in accordance with one embodiment of the present invention where the portable electronic device is in a close position.

Referring also to FIG. 3, in accordance with one embodiment of the present invention the elongated slot 26 of the key gripping portion 24 that fits to a keys ring, have a freedom of movement for the key user to move the key 10 around the key ring and also a certain freedom of key movement to cross the key ring to either direction, inwardly or outwardly due to the elongated slot 26. This freedom of movements enables the plug 50 of the electronic device 10 to be connected freely to a plug receptacle for example of a computer. This freedom of movements is particularly useful when there is a bunch of keys on the key ring. In a fully deployable position as shown for example in FIG. 1 the elongated slot helps the plug 50 of the electronic device 30 to be comfortably connected to a plug receptacle for example of a computer without the disturbance of the bunch of keys in the key ring. Thus, preventing the plug 50 from unintentionally pulled out from the computer plug receptacle which may result in a bad contact or even damaging the plug 50 or the plug contacts 51.

Figure 4:
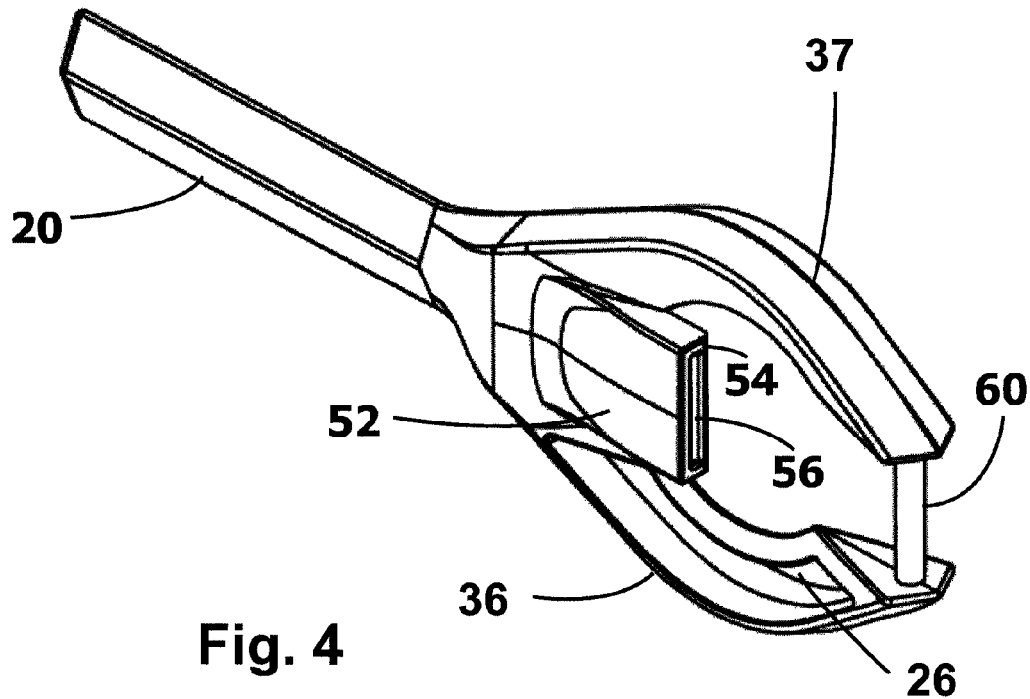
FIG. 4 is a perspective front view of the gripping portion of a key and the blade of the key in accordance with one embodiment of the present invention.
Figure 5:
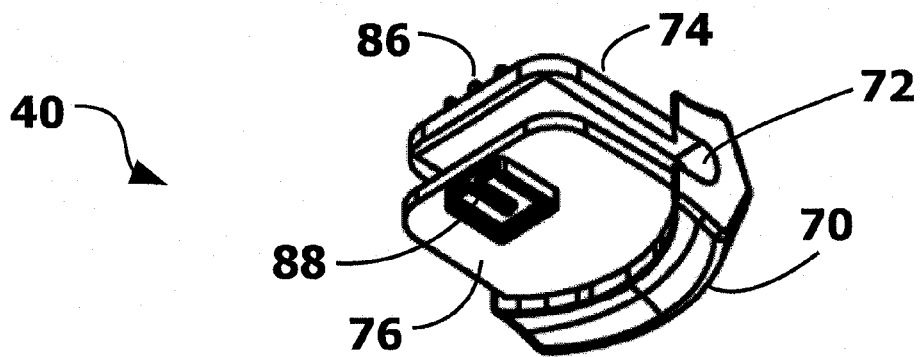
FIG. 5 is a perspective front view of the gripping portion pivot support in accordance with one embodiment of the present invention.

At the upper portion of blade 20 where the gripping portion structure 24 is connected to blade 20 extends a rigid member 52 preferably made of plastic or metal. The shape of the extended member 52 is preferably a rectangular shape although other suitable shapes can be used. Referring also to FIG. 4 at the surface end 54 of rigid member 52 extends a protruded element 56 which is used in associate with protruded element 34 as a latching means for latching the electronic device 30 when the electronic device 30 is folded to a close position for example as shown in FIG. 3. The lower portion of gripping portion 24 along with the upper surface of the rigid element 52 are constructing a recess which is shaped to fit and to host plug 50 when the electronic device 30 is in a closed position. The gripping portion structure 24, also have a hole 53 which is used for the host 32 or portion of host 32 to be fitted in the gripping portion structure when the electronic device 30 is in closed position. In some embodiments of the present invention a recess, not shown, can be formed instead of the hole 51 for the same aforementioned purpose. The key gripping portion structure 24 may have an oval-like shape formed of two curve arms 36 and 37 where the lower ends of the arms are connected to blade 20. The upper ends of the arms 36 and 37 are separated from one another via a cylindrical element 60 connected between them. The cylindrical element 60 may define a pivot axis around which the portable electronic device 30 can pivot to open or closed position.

In operation, in order to lock the electronic device 30 to the gripping portion structure 24 in a close position and preventing the electronic device 30 from reopen unintentionally; the key user needs to do the following steps. The key user needs to manually fold the electronic device from a fully or partially open position to a closed position by manually rotating electronic device 30 around the longitude axis of cylindrical element 60 towards key gripping portion structure 24 until protruded element 56 engages with protruded element 34. In the next step, the key user continue to apply a force with his hand towards the same direction that will be strong enough for protruding element 36 to be partially or fully underneath protruding element 56, thereby, locking or latching the electronic device 30 in a closed position and thus preventing electronic device 30 from being rotating unintentionally backwards to the open position. In order to deploy electronic device to a fully or partially open position the user pulls upwards the electronic device 30 for example with his fingers and thereby protruded element 56 is disengaged from protruded element 34 and the electronic device 30 may rotate around the longitude axis of cylindrical element 60. The user needs to apply enough force for disengaging between the two protruded elements 56, 36 and thereby unlocking electronic device 30 from its close position. Other variation, not shown, can be used for locking and unlocking electronic device 30 and key portion structure 24. For example, by using magnets, the two parts may have magnets portions or electromagnets portions that can be attracted to one another by a magnetic force. Another example, a latch mechanism, which may be released by, for example, depressing a button provide on the exterior of the device housing 32 or key gripping structure 24 and so forth.

Figure 6:
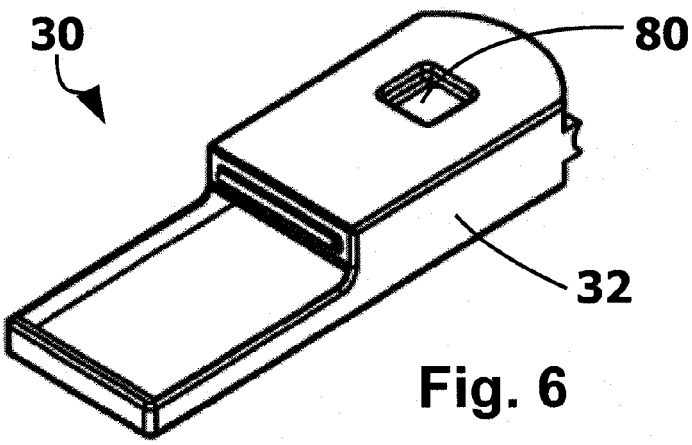
FIG. 6 is a perspective front view of the electronic device housing in accordance with one embodiment of the present invention.
Figure 7:
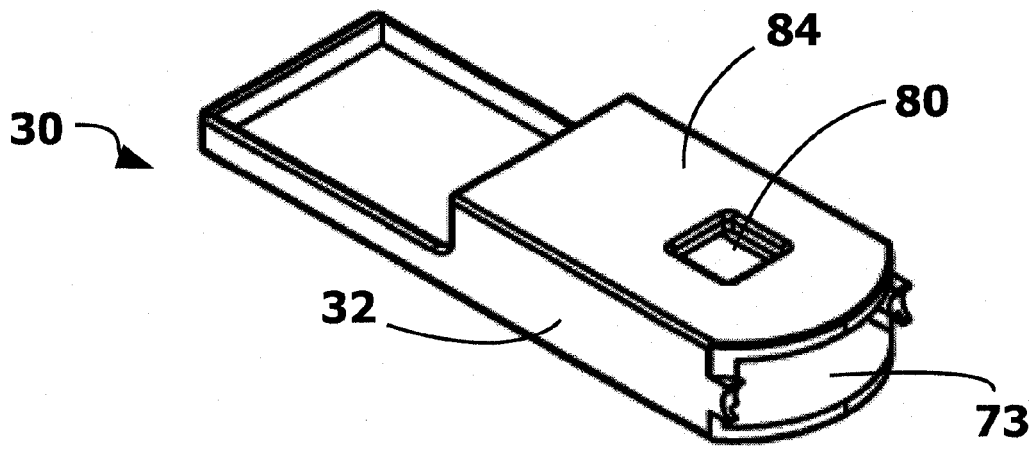
FIG. 7 is a perspective rear view of the electronic device shown in FIG. 6.

In accordance with some embodiments of the present invention the electronic device 30 can be removable from key gripping portion 24 and can be reattached with a latching means. Referring to FIGS. 4, 5, 6 and 7, gripping portion pivot support 40 may be made of plastic having a certain degree of elasticity although other suitable elastic materials can be used. The gripping portion pivot support 40 includes a base portion 70 having a cylindrical elongated recess 72 to be engaged with cylindrical element 60. The elongated recess 72 is wider than the cylindrical element diameter cross section to be sufficient for the gripping portion pivot support 40 to be engaged with cylindrical element 60 and to rotate around the longitude axis of the cylindrical element 60. The gripping portion pivot support 40 further includes two flat surfaces 74 and 76 parallel to one another. The two surfaces extend from the base portion 70. In natural state, the distance between the two surfaces 74 and 76 is smaller than the diameter of the cylindrical element 60. However, when a force caused by the key user is applied outwardly on the sides of the surfaces which pull them further away from one another, the distance between the surfaces 74 and 76 may become larger than the diameter of the cylindrical element 60. Thus, elongated recess 72 can be engaged with the cylindrical element 60. After the elongated recess 72 has been engaged with cylindrical element 60 the distance between the surfaces may returns to the natural state, meaning the distance between the surfaces is shorten and returns to be smaller than the diameter of the cylindrical element 60. Thus, the pivot support is being attached to the key gripping portion 20 and gripping portion pivot support 40 has a certain freedom of movement to rotate around the longitude axis of cylindrical element 60. Referring to FIGS. 6 and 7, the electronic device housing 32 further includes two holes, a hole 80 disposed at the upper surface 84 and another hole, not shown, having the same size and shape is disposed at the bottom surface of housing 32 opposite to hole 80. The electronic device housing further includes a cavity 73 therein at the bottom section that may receive the gripping portion pivot support 40. At the outer surface of each of the surfaces 74 and 76 of gripping portion pivot support 40 extend outwardly protruded elements 86 and 88 that fit to hole 80 and to the opposite hole respectively.

In operation, after installing the gripping portion pivot support 40 with the key portion structure 24 as described above, in order to attach the electronic device 30 to the portion pivot support 40 the user needs to insert plates 74 and 76 to cavity 73 until protruded elements 86 and 88 engaged with hole 80 and the opposite hole respectively. The protruded elements 86 and 88 are being inserted partially or fully through the hole 80 and the opposite hole respectively, thereby, electronic device housing 32 is latched to the gripping portion pivot support 40 and electronic device 30 is being integrated to the key gripping portion and may be rotated to a close or open position. In order to detach the electronic device 30 from the key gripping portion 24 the user needs to press simultaneously on both protruded elements 86 and 88 inwardly and pull the electronic device 30 out from the gripping pivot support 40.

In accordance with some embodiments of the present invention the electronic device housing 32 can be fitted to various electronic devices 30 such as but not limited to portable modems, portable storage devices connectible to a computer or other electronic appliances. Thus, key gripping portion 24 may host various electronic devices and the key user can comfortably replace many electronic devices to be integrated with the key gripping portion 24.

In accordance with another embodiment of the present invention the electronic device housing 32 and the pivot support 40 are colored in a matching color or colors. This is useful for example to match and distinguish between the electronic device of the key user and the electronic device of other user, particularly in situations where the electronic device 30 is detached from the key gripping portion 24.

In some embodiments of the present invention the key gripping portion 24 may have other construction and may include a key housing, not shown. The key housing includes a cavity therein that may receive electronic device 30. The electronic device may be secured within key housing by a latch mechanism, which may released by, for example a depressing button, not shown, provided on the exterior of key housing or the housing of the electronic device 30. When the electronic device 30 is unused the electronic device 30 remains stowed within the key housing. However, when the electronic device is being used the electronic device 30 can be removed and used to be plugged into a plug receptacle such as computer plug receptacle.

It should be understood that the above description is merely exemplary and that there are various embodiments of the present invention that may be devised, mutatis mutandis, and that the features described in the above-described embodiments, and those not described herein, may be used separately or in any suitable combination; and the invention can be devised in accordance with embodiments not necessarily described above.

The invention claimed is:

1. A key held by a key-ring, said key having a blade which slides into a keyway of a lock and distinguishes between different keys, and a key gripping portion, so that torque can be applied by the key user, said key gripping portion comprising: a gripping portion structure; an electronic device housing; an electronic device housed by said electronic device housing, said electronic device having a plug connectable to a plug receptacle of an electronic appliance, said electronic device integrated in said electronic device housing; wherein, along at least one side of said gripping portion structure disposed an elongated slot which is wide enough to be used as a key ring receptacle where the key ring, can pass through; wherein said electronic device housing is pivotally connected to said gripping portion structure and said electronic device housing rotates around a pivot axis at an upper portion of said gripping portion structure; and wherein said gripping portion structure is formed of two curved arms where lower ends of the arms are connected to said blade; upper ends of said arms are separated from one another via a cylindrical element connected between them; said cylindrical element defines the pivot axis around which said electronic device housing can pivot to an open or a closed position.

2. A key according to claim 1, wherein said electronic device is removable and reconnectable to said gripping portion structure.

3. A key according to claim 2, wherein in the closed position said electronic device is latched to said gripping portion structure by a latching means.

4. A key according to claim 3, wherein said latching means comprising a portion of an outer surface of said electronic device housing having a magnet and wherein portion of said gripping portion structure having a magnet portion; whereby, in the closed position said electronic device housing and said gripping portion structure are attracted to one another by a magnetic force.

5. A key according to claim 3, wherein said latching means comprising a rigid member extending from a bottom portion of said gripping portion structure; a protruded element extends from an outer surface of said rigid member; a protruded element extends from an outer surface of said electronic device housing; wherein, said protruded elements engaged with each other in the closed position; whereby, latching said electronic device to said gripping portion structure.

6. A key according to claim 5, wherein a lower portion of said gripping portion structure along with an upper surface of said extended rigid member are constructing a recess which is shaped to fit and to host said plug of said electronic device when the electronic device housing is in the closed position.

7. A key according to claim 6, wherein said gripping portion structure further having, a hole sufficient for said electronic device housing to fit in said gripping portion structure when said electronic device housing is in the closed position.

8. A key according to claim 1, wherein said electronic device housing is pivotally connected to an upper portion of said gripping portion structure by a gripping portion pivot support.

9. A key according to claim 8, wherein said gripping portion pivot support comprises a base portion having a cylindrical elongated recess to be engaged with said cylindrical element; said elongated recess is wider than the cylindrical element diameter cross section to be sufficient for said gripping portion pivot support to be engaged with the cylindrical element and to rotate around said longitude axis of said cylindrical element; said gripping portion pivot support further comprises two flat surfaces parallel to one another; said two flat surfaces extend from said base portion; wherein, in a natural state, the distance between said two flat surfaces is smaller than the diameter of the cylindrical element; however, when a force caused by the key user is applied outwardly on the sides of the flat surfaces which pull them further away from one another, the distance between the flat surfaces becomes larger than the diameter of the cylindrical element; thus, said elongated recess engaged with said cylindrical element; whereby, said gripping portion pivot support has a certain freedom of movement to rotate around the longitude axis of cylindrical element.

10. A key according to claim 8, said electronic device housing further having at least one hole disposed at an outer surface of said electronic device housing; said electronic device housing further comprises a cavity therein at a bottom section that receives said gripping portion pivot support; at an outer surface of at least one of said surfaces of gripping portion pivot support extends a protruded element that fit to said hole of said electronic device housing; whereby, in order to attach said electronic device housing to said gripping portion pivot support said key user needs to insert plates of said gripping portion pivot support to said cavity of said electronic device housing until protruded element of said gripping portion pivot Support engaged with said hole of said electronic device housing; In order to detach said electronic device housing from said gripping portion structure said key user needs to press said protruded element of said gripping portion pivot support inwardly and pull said electronic device out from said gripping portion pivot support.

11. A key according to claim 8, wherein said electronic device housing and said gripping portion pivot support are colored by matching colors.

* * * * *